US009548385B1

(12) United States Patent
Cheng et al.

(10) Patent No.: US 9,548,385 B1
(45) Date of Patent: *Jan. 17, 2017

(54) SELF-ALIGNED CONTACTS FOR VERTICAL FIELD EFFECT TRANSISTORS

(71) Applicant: International Business Machines Corporation, Armonk, NY (US)

(72) Inventors: Kangguo Cheng, Schenectady, NY (US); Wilfried Ernst-August Haensch, Somers, NY (US); Ali Khakifirooz, Los Altos, CA (US); Davood Shahrjerdi, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/041,612

(22) Filed: Feb. 11, 2016

Related U.S. Application Data

(63) Continuation of application No. 14/824,542, filed on Aug. 12, 2015, now Pat. No. 9,312,383.

(51) Int. Cl.

| | |
|---|---|
| H01L 29/66 | (2006.01) |
| H01L 29/78 | (2006.01) |
| H01L 21/84 | (2006.01) |
| H01L 29/417 | (2006.01) |
| H01L 29/06 | (2006.01) |
| H01L 21/768 | (2006.01) |
| H01L 21/311 | (2006.01) |
| H01L 21/02 | (2006.01) |
| H01L 27/12 | (2006.01) |

(52) U.S. Cl.
CPC ..... *H01L 29/7827* (2013.01); *H01L 21/02532* (2013.01); *H01L 21/31111* (2013.01); *H01L 21/76802* (2013.01); *H01L 21/76877* (2013.01); *H01L 21/76897* (2013.01); *H01L 21/84* (2013.01); *H01L 27/1203* (2013.01); *H01L 29/0649* (2013.01); *H01L 29/41741* (2013.01); *H01L 29/41766* (2013.01); *H01L 29/6656* (2013.01); *H01L 29/66666* (2013.01)

(58) Field of Classification Search
CPC .......... H01L 29/7827; H01L 29/66666; H01L 29/66484; H01L 29/7831; H01L 29/42392; H01L 21/823425; H01L 21/823487; H01L 21/84; H01L 21/3086
USPC ....................................................... 257/329
See application file for complete search history.

(56) References Cited

U.S. PATENT DOCUMENTS 6,794,242 B1  9/2004  Dyer et al.
6,812,092 B2  11/2004  Seitz et al.
(Continued)

FOREIGN PATENT DOCUMENTS

KR  1020100052814 A  5/2010
KR     101056060 B1  8/2011

OTHER PUBLICATIONS

English translation for Korean Application No. KR101056060B1.
English translation for Korean Application No. KR1020100052814A.
List of IBM Patents or Patent Applications Treated as Related.

*Primary Examiner* — Trung Q Dang
(74) *Attorney, Agent, or Firm* — Louis J. Percello; Ryan, Mason & Lewis, LLP

(57) ABSTRACT

Semiconductor devices having vertical field effect transistors with self-aligned source and drain contacts are provided, as well as methods for fabricating vertical field effect transistors with self-aligned source and drain contacts.

18 Claims, 11 Drawing Sheets

(56) References Cited

U.S. PATENT DOCUMENTS

| | | | |
|---|---|---|---|
| 7,176,089 | B2 | 2/2007 | Furukawa et al. |
| 9,312,383 | B1 * | 4/2016 | Cheng ................. H01L 29/7827 |
| 2010/0207201 | A1 | 8/2010 | Masuoka et al. |
| 2010/0295121 | A1 | 11/2010 | Ikebuchi |
| 2012/0248529 | A1 | 10/2012 | Liu et al. |
| 2013/0023095 | A1 | 1/2013 | Nojima |
| 2015/0287821 | A1 | 10/2015 | Masuoka et al. |

* cited by examiner

100

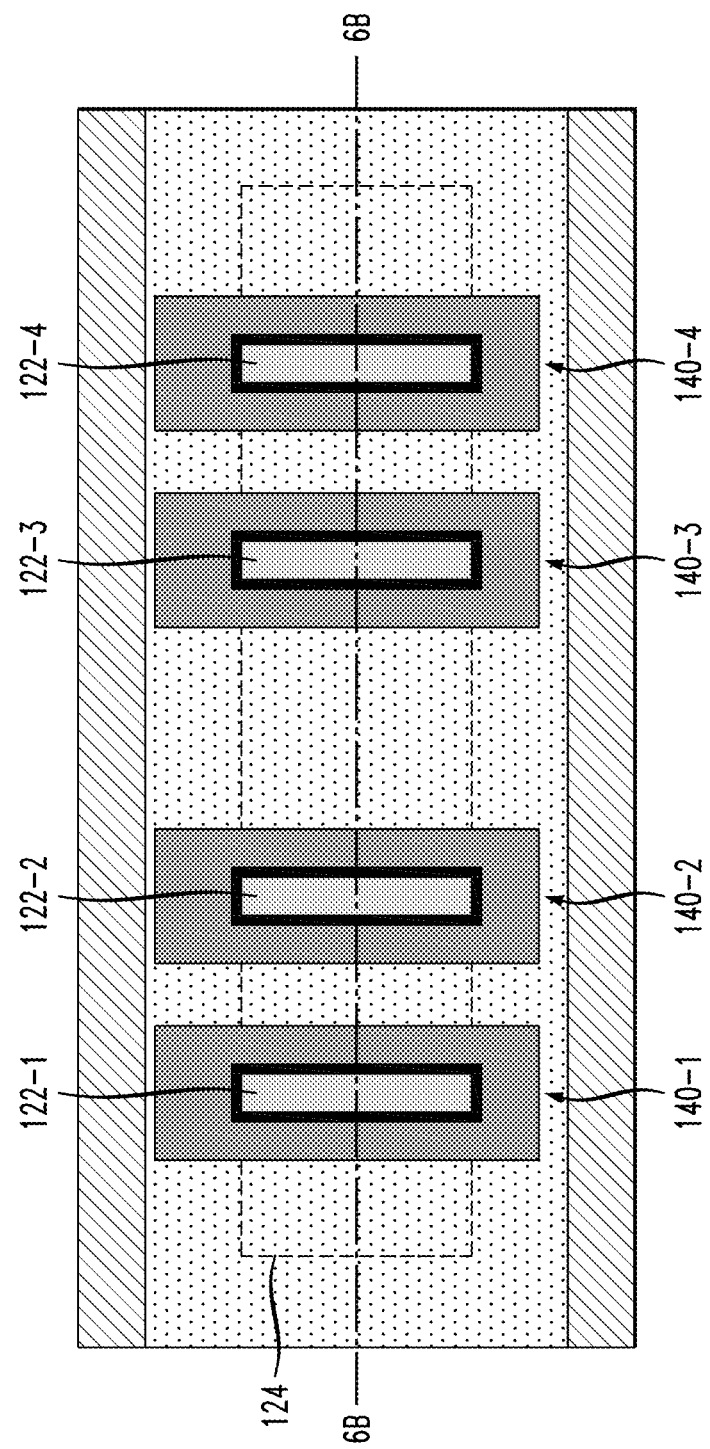

SELF-ALIGNED CONTACTS FOR VERTICAL FIELD EFFECT TRANSISTORS

CROSS-REFERENCE TO RELATED APPLICATIONS

This application is a Continuation of U.S. patent application Ser. No. 14/824,542, filed on Aug. 12, 2015, which is incorporated herein by reference.

TECHNICAL FIELD

This disclosure relates generally to semiconductor fabrication techniques and, in particular, to structures and methods for fabricating vertical semiconductor transistor devices.

BACKGROUND

Traditional CMOS (complementary metal oxide semiconductor) techniques include process flows for constructing planar transistors. With planar transistors, transistor density can be increased by decreasing the pitch between transistor gate elements. However, with planar transistors, the ability to decrease gate pitch is limited by the required gate length and spacer thickness. In recent years, there has been significant research and development with regard to vertical transistor structures, which decouple the gate length from the gate pitch requirement and enable scaling of transistor density. In general, vertical transistors are designed to have gate structures that are disposed on multiple sides of a vertical semiconductor fin structure or vertical nanowire. With vertical transistors, device scaling is determined by how closely conductive via contacts to source and drain regions can be placed. Unlike planar transistors, however, where self-aligned contact processes (which determine the spacing between source/drain contacts and a gate electrode) can be used, there are no known techniques for forming self-aligned source/drain contacts for vertical transistors.

SUMMARY

Embodiments of the invention generally include semiconductor devices having vertical field effect transistors with self-aligned source and drain contacts, as well as methods for fabricating vertical field effect transistors with self-aligned source and drain contacts.

For example, one embodiment of the invention includes a method of forming a semiconductor device. A semiconductor structure is patterned from an active semiconductor layer of a substrate. The patterned semiconductor structure includes a planar semiconductor slab, and first and second semiconductor fins vertically extending from the planar semiconductor slab. A first insulating spacer is formed to cover the planar semiconductor slab. A first gate structure is formed around a lower portion of the first semiconductor fin and a second gate structure is formed around a lower portion of the second semiconductor fin. A second insulating spacer is formed which covers a least a portion of the first and second gate structures surrounding the first and second semiconductor fins and which fills a space between the first and second gate structures. First and second source/drain structures are formed on exposed portions of the first and second semiconductor fins extending from the second insulating spacer. A third source/drain structure is formed on an exposed portion of the planar semiconductor slab adjacent the first and second insulating spacers. A pre-metal dielectric layer is formed over the substrate. First and second conductive via contacts are then formed in the pre-metal dielectric layer, wherein the first conductive via contact is formed self-aligned to the first and second source/drain structures, and wherein the second conductive via contact is formed self-aligned to the third source/drain structure.

Another embodiment of the invention includes a semiconductor device having a patterned semiconductor structure patterned from an active semiconductor layer of a substrate, wherein the patterned semiconductor structure includes a planar semiconductor slab, and first and second semiconductor fins vertically extending from the planar semiconductor slab. A first insulating spacer covers the planar semiconductor slab. A first gate structure is disposed around a lower portion of the first semiconductor fin, and a second gate structure is disposed around a lower portion of the second semiconductor fin. A second insulating spacer covers at least a portion of the first and second gate structures surrounding the first and second semiconductor fins, and fills a space between the first and second gate structures. First and second source/drain structures are formed on exposed portions of the first and second semiconductor fins extending from the second insulating spacer. A third source/drain structure is formed on an exposed portion of the planar semiconductor slab adjacent the first and second insulating spacers. A pre-metal dielectric layer is disposed over the substrate. First and second conductive via contacts are formed in the pre-metal dielectric layer, wherein the first conductive via contact is self-aligned to the first and second source/drain structures, and wherein the second conductive via contact is self-aligned to the third source/drain structure.

These and other embodiments will be described in the following detailed description of embodiments, which is to be read in conjunction with the accompanying figures.

BRIEF DESCRIPTION OF THE DRAWINGS

FIGS. 1A and 1B are schematic views of a semiconductor device having vertical field effect transistors with self-aligned source and drain contacts, according to an embodiment of the invention, wherein FIG. 1A is a schematic cross-sectional view of the semiconductor device taken along line 1A-1A in FIG. 1B, and wherein FIG. 1B is a schematic top plan view of the semiconductor device viewed from line 1B-1B in FIG. 1A.

FIGS. 2, 3, 4A/4B, 5, 6A/6B, 7, 8, 9, and 10 schematically illustrate a method for fabricating the semiconductor device of FIGS. 1A/1B, according to an embodiment of the invention, wherein:

FIG. 2 is a schematic cross-sectional side view of a semiconductor structure at an initial stage of fabrication starting with a silicon-on-insulator substrate, according to an embodiment of the invention;

FIG. 3 is a schematic cross-sectional side view of the semiconductor structure of FIG. 2 after forming a plurality of vertical semiconductor fin structures and a planar semiconductor slab structure, according to an embodiment of the invention;

FIGS. 4A and 4B are schematic views of the semiconductor structure of FIG. 3 after forming a lower insulating spacer, according to an embodiment of the invention, wherein FIG. 4A is a schematic top plan view of the semiconductor structure, and wherein FIG. 4B is a schematic cross-sectional side view of the semiconductor structure taken along line 4B-4B in FIG. 4A;

FIGS. 6A and 6B are schematic views of the semiconductor structure of FIG. 5 after patterning the conformal gate stack structure to form gate structures that surround lower portions of the vertical semiconductor fin structures, according to an embodiment of the invention, wherein FIG. 6A is a schematic top plan view of the semiconductor structure, and wherein FIG. 6B is a schematic cross-sectional side view of the semiconductor structure taken along line 6B-6B in FIG. 6A;

DETAILED DESCRIPTION OF EMBODIMENTS

Embodiments of the invention will now be described in further detail with regard to semiconductor devices having vertical field effect transistors with self-aligned source and drain contacts, as well as methods for fabricating vertical field effect transistors with self-aligned source and drain contacts. It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount.

Figure 1A:
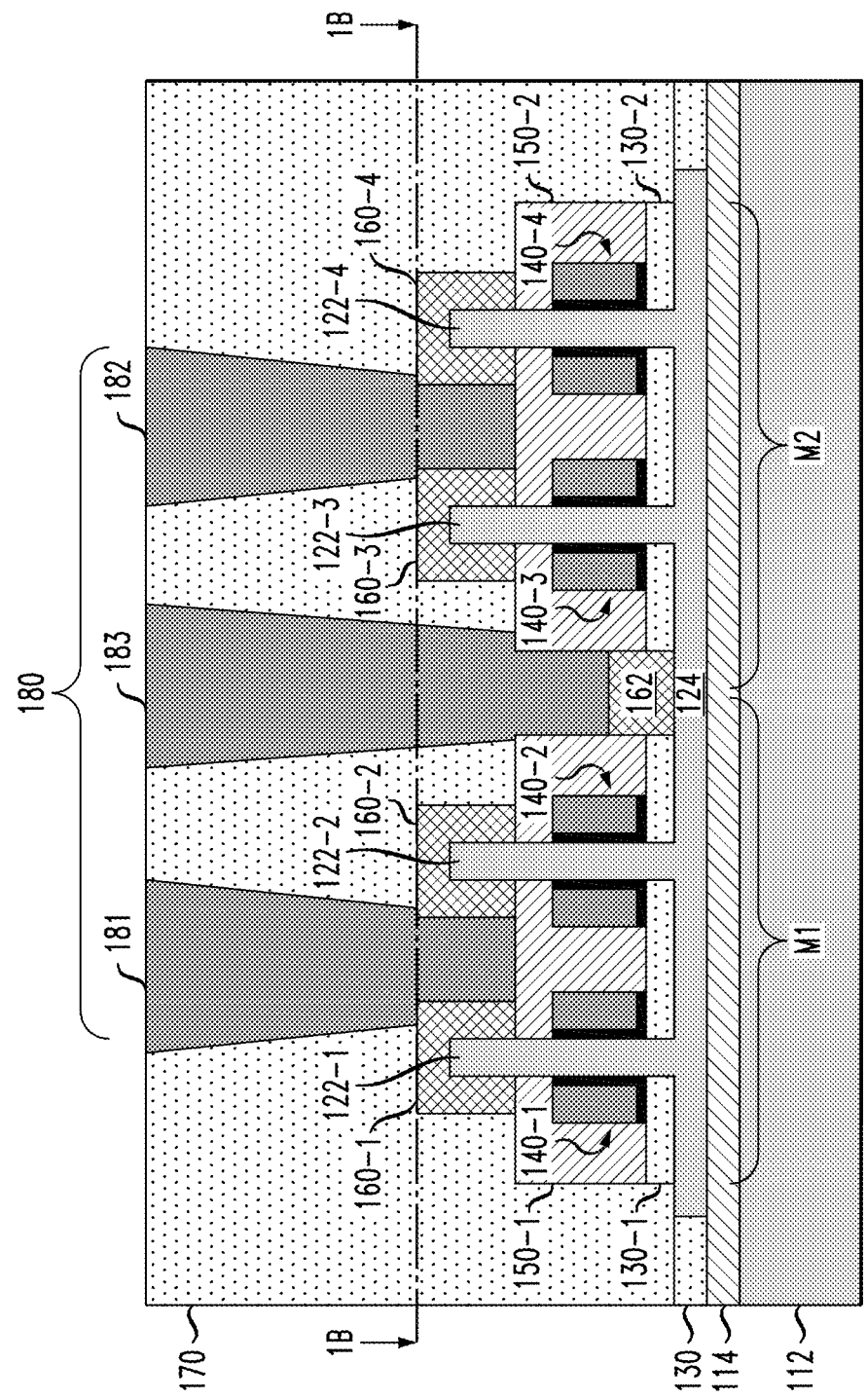
Figure 1B:
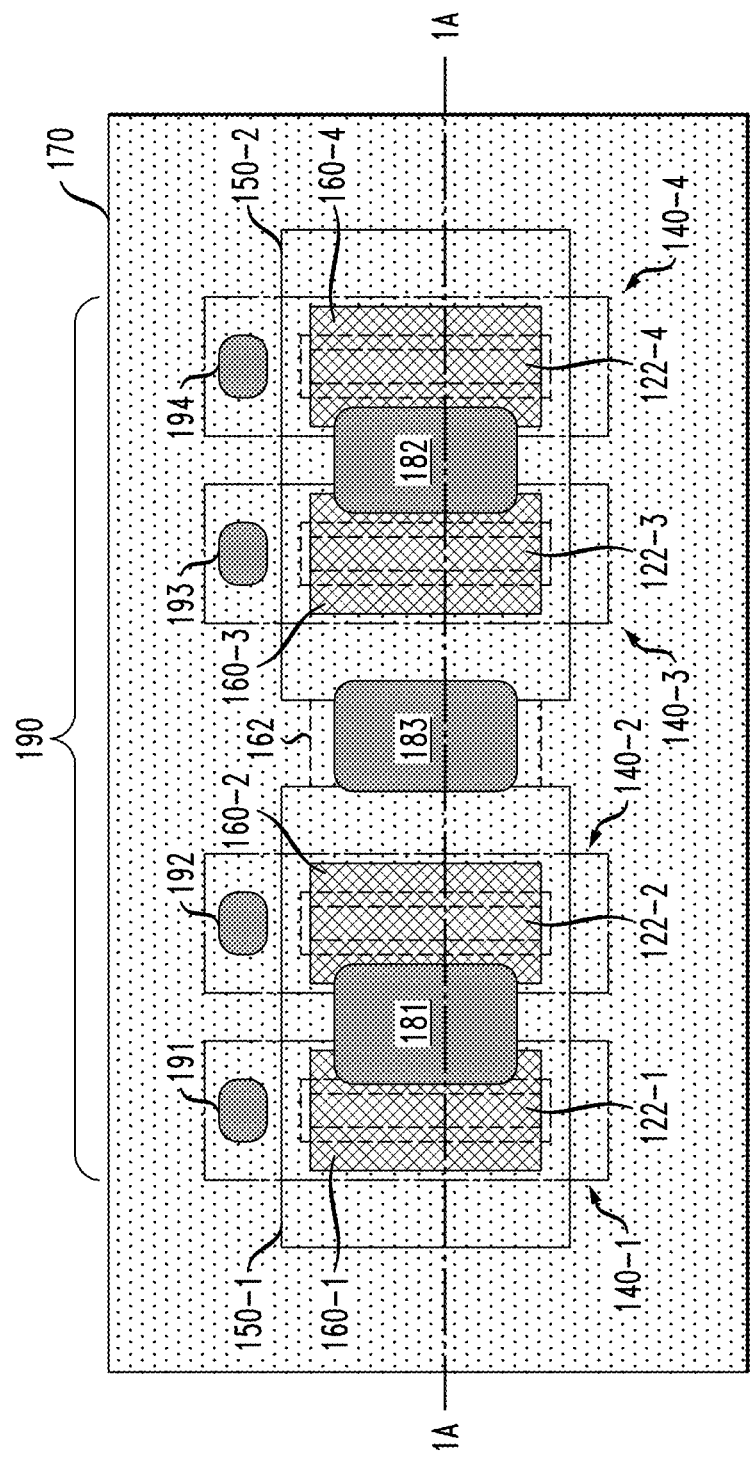

FIGS. 1A and 1B are schematic views of a semiconductor device 100 having vertical field effect transistors with self-aligned source and drain contacts, according to an embodiment of the invention. In particular, FIG. 1A is a schematic cross-sectional view of the semiconductor device 100 taken along line 1A-1A in FIG. 1B, and FIG. 1B is a schematic top plan view of the semiconductor device 100 viewed from line 1B-1B in FIG. 1A. As shown in FIGS. 1A/1B, the semiconductor device 100 comprises a substrate 110 having a bulk layer 112 and an insulating layer 114. A semiconductor structure is patterned from an active semiconductor layer (e.g., layer 116, FIG. 2) of the substrate 110, wherein the patterned semiconductor structure (e.g., structure 120, FIG. 3) comprises a plurality of semiconductor fin structures 122-1, 122-2, 122-3, and 122-4 (collectively referred to as semiconductor fin structures 122) and a planar semiconductor slab structure 124. The semiconductor fin structures 122 vertically extend from the planar semiconductor slab structure 124.

The semiconductor device 100 further comprises a first insulating spacer layer 130 which is patterned to form a first lower insulating spacer 130-1 and a second lower insulating spacer 130-2. A first gate structure 140-1 is disposed around a lower portion of the first semiconductor fin structure 122-1. A second gate structure 140-2 is disposed around a lower portion of the second semiconductor fin structure 122-2. A third gate structure 140-3 is disposed around a lower portion of the third semiconductor fin structure 122-3. A fourth gate structure 140-4 is disposed around a lower portion of the fourth semiconductor fin structure 122-4. The gate structures 140-1, 140-2, 140-3, and 140-4 (collectively referred to as gate structures 140) are electrically insulated from the semiconductor slab structure 124 by the respective first and second lower insulating spacers 130-1 and 130-2.

The semiconductor device 100 further comprises a first upper insulating spacer 150-1 that covers a least a portion of the first and second gate structures 140-1 and 140-2 surrounding the lower portions of the first and second semiconductor fin structures 122-1 and 122-2, and a second upper insulating spacer 150-2 that covers a least a portion of the third and fourth gate structures 140-3 and 140-4 surrounding the lower portions of the third and fourth semiconductor fin structures 122-3 and 122-4. As explained below, the first and second upper insulating spacers 150-1 and 150-2 are patterned from a conformal insulating layer 150 (FIG. 7) which is deposited to fill the spaces between adjacent gate structures 140-1/140-2 and 140-3/140-4, and to fill at least a portion of the spaces between adjacent pairs of semiconductor fin structures 122-1/122-2 and 122-3/122-4 above the adjacent gate structures 140-1/140-2 and 140-3/140-4.

As further shown in FIGS. 1A and 1B, the semiconductor device 100 comprises a plurality of source/drain structures 160-1, 160-2, 160-3, 160-4, which are formed on exposed portions of respective semiconductor fin structures 122-1, 122-2, 122-3, and 122-4, which extend from the first and second upper insulating spacers 150-1 and 150-2. In addition, a source/drain structure 162 is formed on an exposed portion of the semiconductor slab structure 124 between the first upper/lower spacers 150-1/130-1 and the second upper/lower spacers 150-2/130-2. The term "source/drain structure" means that a given structure can be either a source or a drain, depending on the application.

A pre-metal dielectric layer 170 is formed over the substrate, and a plurality of source/drain contacts 180 are formed in the pre-metal dielectric layer 170 using a self-aligned process as discussed in further detail below. In particular, as shown in FIGS. 1A and 1B, a first conductive via contact 181 is self-aligned to (and in contact with) the source/drain structures 122-1 and 122-2, a second conductive via contact 182 is self-aligned to (and in contact with) the source/drain structures 160-3 and 160-4, and a third via contact 183 is self-aligned to (and in contact with) the source/drain structure 162.

As further shown in FIG. 1B, the semiconductor device 100 further comprises a plurality of gate via contacts 190 formed in the pre-metal dielectric layer 170 which contact portions of the gate structures 140 which are not covered by the upper insulating spacers 150-1 and 150-2. In particular, a first gate contact 191 is formed through the pre-metal dielectric layer 170 in contact with an end portion of the first gate structure 140-1. A second gate contact 192 is formed through the pre-metal dielectric layer 170 in contact with an end portion of the second gate structure 140-2. A third gate contact 193 is formed through the pre-metal dielectric layer 170 in contact with an end portion of the third gate structure 140-3. A fourth gate contact 194 is formed through the pre-metal dielectric layer 170 in contact with an end portion of the fourth gate structure 140-4.

In the illustrative embodiment of FIGS. 1A and 1B, the first and second semiconductor fin structures 122-1 and 122-2, the planar semiconductor slab structure 124, the first upper and lower insulating spacers 150-1 and 130-1, the first and second gate structures 140-1 and 140-2, and the source/drain structures 160-1, 160-2 and 162 form a single field-effect transistor device M1. Similarly, the third and fourth semiconductor fin structures 122-3 and 122-4, the planar semiconductor slab structure 124, the second upper and lower insulating spacers 150-2 and 130-2, the third and fourth gate structures 140-3 and 140-4, and the source/drain structures 160-3, 160-4 and 162 form a single field-effect transistor device M2.

The source/drain structure 162 provides a common bottom source/drain structure for both transistors M1 and M2. The source/drain structures 160-1 and 160-2 provide an upper source/drain structure for the transistor M1, and the source/drain structures 160-3 and 160-4 provide an upper source/drain structure for the transistor M2. The semiconductor fin structures 122-1 and 122-2 and gate structures 140-1 and 140-2 collectively provide a gate electrode/channel structure for transistor M1, and the semiconductor fin structures 122-3 and 122-4 and gate structures 140-3 and 140-4 collectively provide a gate electrode/channel structure for transistor M2.

In this regard, each transistor M1 and M2 comprises a plurality of transistor segments (e.g., two segments in the illustrative embodiment), which are connected in parallel. In this context, "parallel" means that for, e.g., transistor M1, the upper source/drain structures 160-1 and 160-2 are commonly connected to the via contact 181, which are shared by the individual gate segments 122-1/140-1 and 122-2/140-2, and the lower source/drain structure 162 is commonly connected and shared by the individual gate segments 122-1/140-1 and 122-2/140-2. Similarly, for transistor M2, the upper source/drain structures 160-3 and 160-4 are commonly connected to the via contact 182, which are shared by the individual gate segments 122-3/140-3 and 122-4/140-4, and the lower source/drain structure 162 is commonly connected and shared by the individual gate segments 122-3/140-3 and 122-4/140-4. Moreover, in the illustrative embodiment of FIGS. 1A/1B, the transistors M1 and M2 are connected in series.

With the "parallel" connected segments, while the drains and sources are commonly connected, the gate terminals may or may not be commonly connected. For example, referring to FIG. 1B, if the gate contacts 191 and 192 are commonly connected, the individual segments of the transistor M1 are concurrently activated or deactivated based on the voltage applied to the gate contacts 191/192. Similarly, if the gate contacts 193 and 194 are commonly connected, the individual segments of the transistor M2 are concurrently activated or deactivated based on the voltage applied to the gate contacts 193/194. On the other hand, when the gate contacts 191 and 192 of transistor M1 are not commonly connected, or when the gate contacts 193 and 194 of transistor M2 are not commonly connected, the different segments of the transistors M1 and/or M2 can be independently controlled to selectively activate or deactivate the different segments of M1 and M2, as needed, depending on the application (e.g., controllably adjust the driving strength (amount of current) of the transistors M1 and M2.

Figure 2:
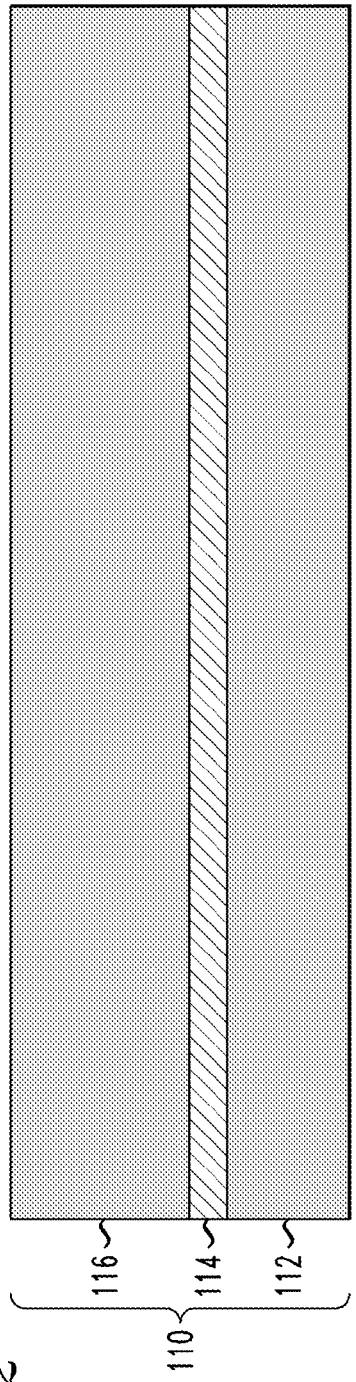

Methods for fabricating the semiconductor device 100 shown in FIGS. 1A/1B will now be discussed in further detail with reference to FIGS. 2, 3, 4A/4B, 5, 6A/6B, 7, 8, 9, and 10, which schematically illustrate the semiconductor device 100 at various stages of fabrication. FIG. 2 is a cross-sectional view of a semiconductor structure at an initial stage of fabrication starting with a silicon-on-insulator substrate 110, according to an embodiment of the invention. As shown in FIG. 2, the substrate 110 comprises a base substrate layer 112, an insulating layer 114 (e.g., buried oxide layer) and an active semiconductor layer 116 (or SOI layer 116). The insulating layer 114 isolates the active semiconductor layer 116 from the base substrate 112.

The base substrate 112 may be made from any of several known semiconductor materials such as, for example, silicon, germanium, silicon-germanium alloy, silicon carbide, silicon-germanium carbide alloy, or compound semiconductor materials (e.g. III-V and II-VI). Non-limiting examples of compound semiconductor materials include gallium arsenide, indium arsenide, and indium phosphide. The thickness of the base substrate 112 will vary depending on the application. For example, the base substrate 112 may have a thickness in a range of about 0.5 mm to about 1.5 mm.

The insulating layer 114 may be formed of any dielectric or insulating material which is suitable for the given application. For example, the insulating layer 114 may be formed of material such as, for example, oxides, nitrides, oxynitrides of silicon, and combinations thereof. In addition, the insulating layer 114 may include crystalline or non-crystalline dielectric material. In one embodiment, the insulating layer 114 has a thickness in a range of about 100 ran to about 500 nm, for example.

The SOI layer 116 may be made of silicon or other suitable types of semiconductor materials, such as materials used for the base substrate 112. In general, the base substrate 112 and the SOI layer 116 may include either the same, similar, or different semiconducting materials with respect to chemical composition, dopant concentration, and crystallographic orientation. In one embodiment of the invention, the SOI layer 116 is formed of silicon or silicon-germanium, for example. The SOI layer 116 may be doped with p-type dopants such as boron or doped with n-type dopants such as phosphorus and/or arsenic. The SOI layer 116 may have a thickness ranging from about 30 nm to about 100 nm, for example.

In another embodiment of the invention, the substrate 110 may comprise a bulk semiconductor substrate formed of, e.g., silicon, or other types of semiconductor substrate materials that are commonly used in bulk semiconductor fabrication processes. In this embodiment, the insulating layer 114 may comprise an embedded doped layer that is formed at some depth below the active surface of the bulk substrate using an ion implantation process in which dopant ions are accelerated in an electrical field and impacted into the surface of the bulk substrate. The energy of the dopant ions, as well as the ion species and the material composition of the substrate surface will determine the depth of penetration of the ions into the surface of the bulk substrate.

Depending on the application, the embedded doped layer (e.g., layer 114) may comprise an n-doped layer that is formed by ion implanting a n-type dopant species (e.g., phosphorus or arsenic) into the bulk substrate, or a p-doped layer that is formed by ion implanting a p-type dopant species (e.g., boron) into the bulk substrate, using known techniques. In regions of the bulk substrate in which p-type transistors are formed in the active surface, the embedded doped layer would be n-doped, and in regions of the bulk substrate in which n-type transistor devices are formed in the active surface, the embedded doped layer would be p-doped. In this regard, a voltage could be applied to the embedded doped layer to maintain the junction between the embedded doped layer 114 and the active silicon layer 118 in a reversed bias state to provide junction isolation from the underlying portion 112 of the bulk substrate.

A next step in the illustrative fabrication process comprises patterning the SOI layer 116 to form one or more isolated semiconductor wire/slab structures in the surface of the substrate 110. For example, FIG. 3 is a schematic cross-sectional side view of the semiconductor structure of FIG. 2 after forming a patterned semiconductor structure 120 comprising vertical semiconductor fin structures 122 and an isolated planar semiconductor slab structure 124, according to an embodiment of the invention. In one embodiment of the invention, the patterned semiconductor structure 120 is formed using standard photolithographic etch processes.

For example, in a first etch process, a layer of photoresist material is deposited on top of the SOI layer 116 and lithographically patterned (exposed and developed) to form a photoresist mask having a target pattern which defines the corresponding vertical semiconductor fin structures 122 to be transferred to the semiconductor layer 116. An etch process is then performed using the photoresist mask to etch exposed portions of the SOI layer 116 down to a target depth in the SOI layer 116 above the insulating layer 114 to form the semiconductor fin structures 122. The etch process can be performed using a dry etch process such as RIE (reactive ion etching) or other anisotropic etch processes with etching chemistries that are suitable to etch the material of the SOI layer 116.

Next, a second etch process is performed by forming an etch mask which covers the vertical semiconductor fin structures 122 and which is patterned to expose a portion of the remaining SOI layer 116 surrounding the vertical semiconductor fin structures 122 which is to be removed to form the isolated planar semiconductor slab structure 124. The exposed portion of the remaining SOI layer 116 is then etched down to the insulating layer 114 to form the pattern of the planar semiconductor slab structure 124, which is isolated from other active layers of adjacent device/components formed in the active SOI layer 116.

It is to be understood the semiconductor fin structures 122 are formed to have a width and height that is suitable for the given application. For example, in one embodiment of the invention, the vertical semiconductor fin structures 122 are formed to have a width in a range of about 6 nm to about 20 nm, depending on the application. In addition, depending on the thickness of the SOI layer 116, the semiconductor fin structures 122 have a height of about 30 nm to about 100 nm. Moreover, the semiconductor fin structures 122 are formed with certain spacing S1 and S2 as shown in FIG. 3.

Figure 3:
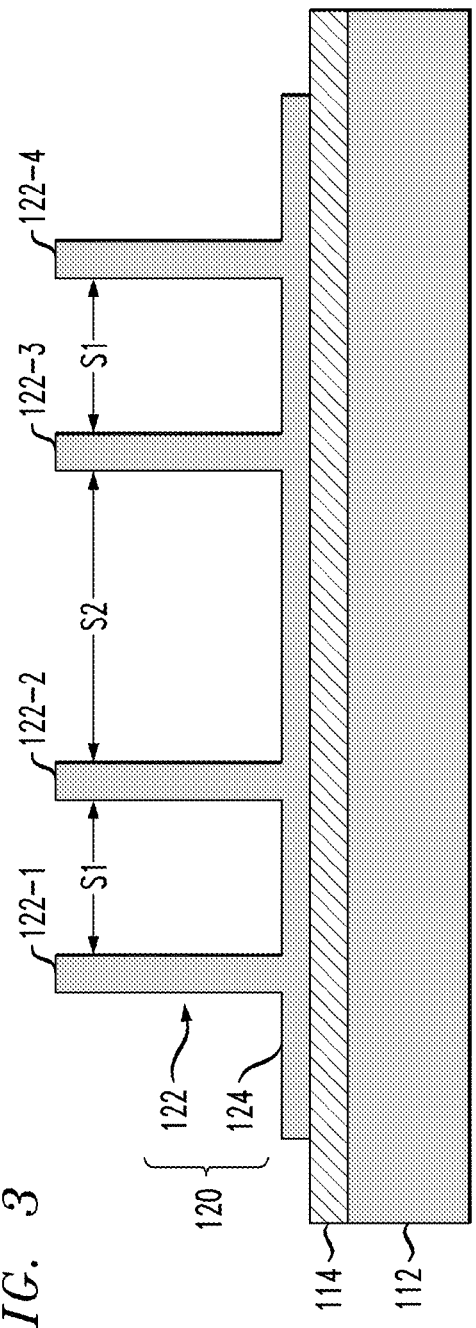

In particular, as shown in FIG. 3, corresponding pairs of semiconductor fin structures 122-1/122-2 and 122-3/122-4 are separated by the spacing S1. In one embodiment, as explained in detail below, the spacing S1 is selected as minimal as possible to achieve high integration density, while maintaining a sufficient insulating space S3 (see, e.g., FIGS. 6B and 7) between sidewalls surfaces of adjacent gate structures. For example, the value of S1 is selected based on the target thickness of the different layers of the gate structures 140 so that a minimum insulating spacing S3 of no less than about 5 nm is obtained between adjacent gate structures. In one embodiment of the invention, the value of S1 is about 20 nm or less, depending on the technology node implemented.

Moreover, as shown in FIG. 3, the spacing between adjacent semiconductor fin structures (e.g., 122-2 and 122-3) of adjacent FET transistor devices M1 and M2 is denoted by S2. As explained in further detail below, the value of S2 is selected as minimal as possible to achieve high integration density, while providing sufficient spacing S4 (e.g., FIG. 7, 8) between the first and second upper insulating spacers 150-1 and 150-2 to enable formation of the self-aligned via contact 183 to the source/drain structure 162.

It is to be understood that for ease of illustration and explanation, the example embodiments discussed herein show the two pairs of semiconductor fin structures 122-1/122-2 and 122-3/122-4 for each transistor M1 and M2 formed of two parallel transistor segments. However, vertical FET transistors can be fabricated with more than two parallel connected transistor segments, in which case each transistor M1 and M2 (FIG. 1A) would have three or more closely spaced (S1) semiconductor fin structures.

A next step in the illustrative fabrication process is to form an insulating spacer to cover the planar semiconductor slab structure 124. FIGS. 4A and 4B are schematic views of the semiconductor structure of FIG. 3 after forming the lower insulating spacer layer 130, according to an embodiment of the invention. In particular, FIG. 4A is a schematic top plan view of the semiconductor structure, and FIG. 4B is a schematic cross-sectional side view of the semiconductor structure taken along line 4B-4B in FIG. 4A. As noted above, the lower insulating spacer layer 130 serves to insulate the planar semiconductor slab structure 124 from the gate electrode structures that are formed in a subsequent process flow described below.

In one embodiment of the invention, the lower insulating spacer layer 130 can be formed as follows. A blanket layer of dielectric/insulating material is deposited over the semiconductor structure of FIG. 3 to fill the spaces between the vertical semiconductor fin structures 122 and to cover the vertical semiconductor fin structures 122. In one embodiment of the invention, the dielectric/insulating layer may be formed of any suitable material such as, e.g., silicon oxide, silicon nitride, hydrogenated silicon carbon oxide, silicon based low-k dielectrics, porous dielectrics, or organic dielectrics including porous organic dielectrics. In addition, the dielectric/insulating layer may be formed using known suitable deposition techniques, such as, for example, atomic layer deposition (ALD), chemical vapor deposition (CVD), plasma enhanced chemical vapor deposition, spin on deposition, physical vapor deposition (PVD), or molecular beam deposition (MBD).

The blanket layer of dielectric/insulating material is then etched down to the top surfaces of the vertical semiconductor fin structures 122 using a standard etch process such as chemical-mechanical planarization (CMP), wherein the surface of the blanket layer of dielectric/insulating material is planarized to expose the top surfaces of the vertical semiconductor fin structures 122. A recess etch process is then performed using ME, for example, to recess the planarized layer of dielectric/insulating material and form the lower insulating spacer layer 130 as shown in FIGS. 4A and 4B. In one embodiment, a selective recess etch process is performed to etch the layer of dielectric/insulating material using an RIE etch process which is selective to the material of the vertical semiconductor fin structures 122, so that the dielectric/insulating material is etched as a much higher rate than the material of the vertical semiconductor fin structures 122.

After forming the lower insulating spacer layer 130, the process flow continues to form the gate structures 140-1, 140-2, 140-3, and 140-4 that wrap around the lower portions of the respective vertical semiconductor fin structures 122-1, 122-2, 122-3, and 122-4, as shown in FIGS. 1A and 1B. In one embodiment of the invention, the gate structures 140-1, 140-2, 140-3, and 140-4 are formed by depositing multiple conformal layers of gate material to form a conformal gate stack structure, followed by one or more etch processes to etch the conformal gate stack structure and form the gate structures 140-1, 140-2, 140-3, and 140-4. In one embodiment of the invention, the gate structures 140-1, 140-2, 140-3, and 140-4 (shown in FIGS. 1A/1B) are formed using a process that is schematically illustrated in FIGS. 5 and 6A/6B.

Figure 4:
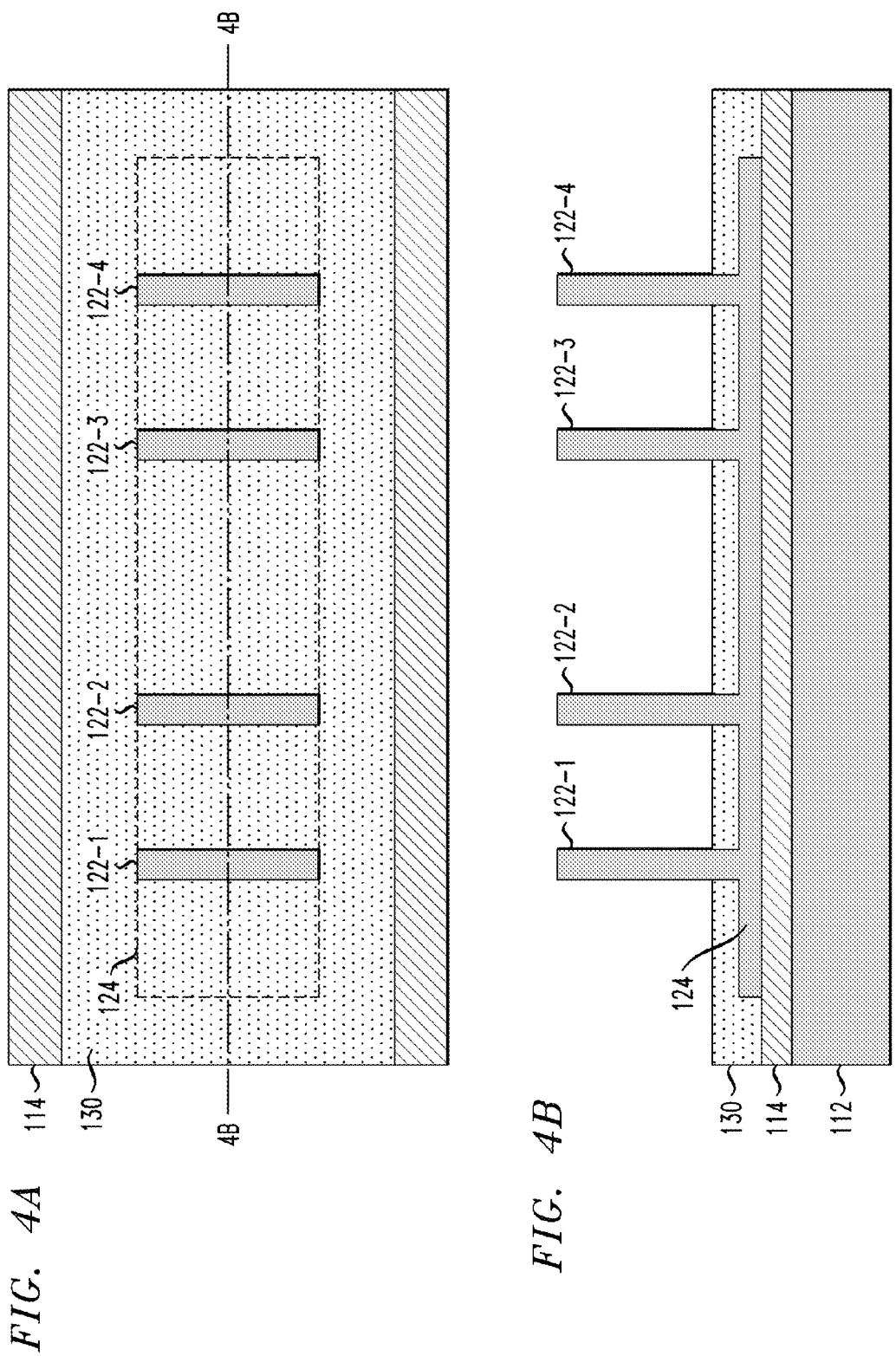
Figure 5:
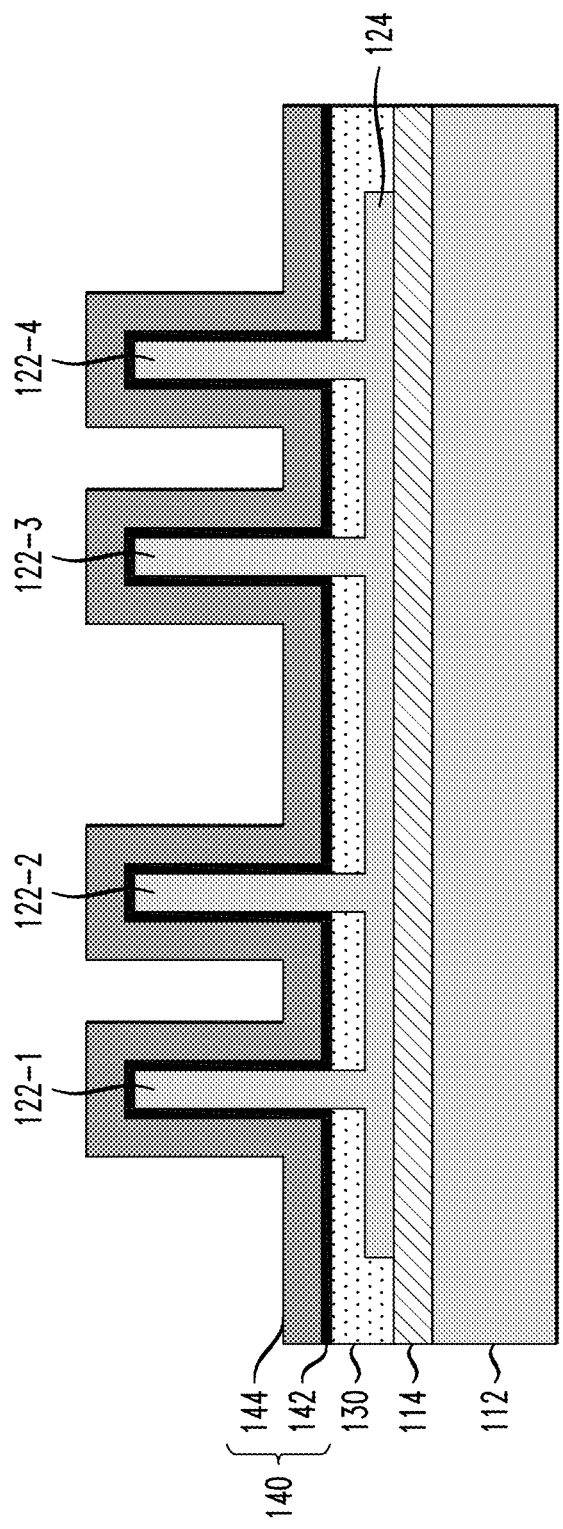
FIG. 5 is a schematic cross-sectional side view of the semiconductor structure of FIG. 4B after forming a conformal gate stack structure, according to an embodiment of the invention.

For example, FIG. 5 is a schematic cross-sectional side view of the semiconductor structure of FIG. 4B after forming a conformal gate stack structure 140, according to an embodiment of the invention. The conformal gate stack structure 140 comprises a gate dielectric layer 142 and a gate electrode layer 144. In one embodiment of the invention, the gate dielectric layer 142 is formed by depositing one or more conformal layers of insulating/dielectric material to coat the exposed portions of the vertical semiconductor fin structures 122. Moreover, the gate electrode layer 144 is formed by depositing one or more conformal layers of metallic and/or conductive material on the gate dielectric layer 142.

The type of insulating/dielectric material(s) used to form the gate dielectric layer 142 will vary depending on the application. For example, the conformal gate dielectric layer 142 may comprise, e.g., nitride, oxynitride, or oxide or high-k materials such as $SiO_2$, $HfO_2$, $ZrO_2$, $Al_2O_3$, $TiO_2$, $La_2O_3$, $SrTiO_3$, $LaAlO_3$, and mixtures thereof. In one embodiment of the invention, the conformal dielectric layer 142 has a thickness in a range of about 0.5 nm to about 2.5 nm, which will vary depending on the target application. The conformal dielectric layer 142 is deposited using known methods such as ALD, CVD, or PVD, for example.

Further, in one embodiment of the invention, the gate electrode layer 144 is formed by depositing a conformal work function metal layer followed by one or more conformal layers of metallic or conductive material. In particular, a conformal work function metal layer is initially formed directly on the gate dielectric layer 142. For example, the work function metal may comprise, for example, Zr, W, Ta, Hf, Ti, Al, Ru, Pa, metal oxides, metal carbides, metal nitrides, transition metal aluminides (e.g. $Ti_3Al$, ZrAl), TaC, TiC, TaMgC, or any combination thereof.

Moreover, the gate electrode layer 144 comprises one or more conformal layers of metallic/conductive material formed over the conformal work function metal layer. For example, the gate electrode layer 144 may be formed of materials such as tungsten, doped polysilicon material, or any metallic or conductive material that is commonly used to form gate electrode structures. In one embodiment of the invention, the conformal gate electrode layer 144 has a thickness in a range of about 4.0 nm to about 7.0 nm, which will vary depending on the target application. The conformal layers of the gate electrode layer 144 can be deposited using known methods such as ALD, CVD, PVD, or MBD, for example.

Figure 6B:
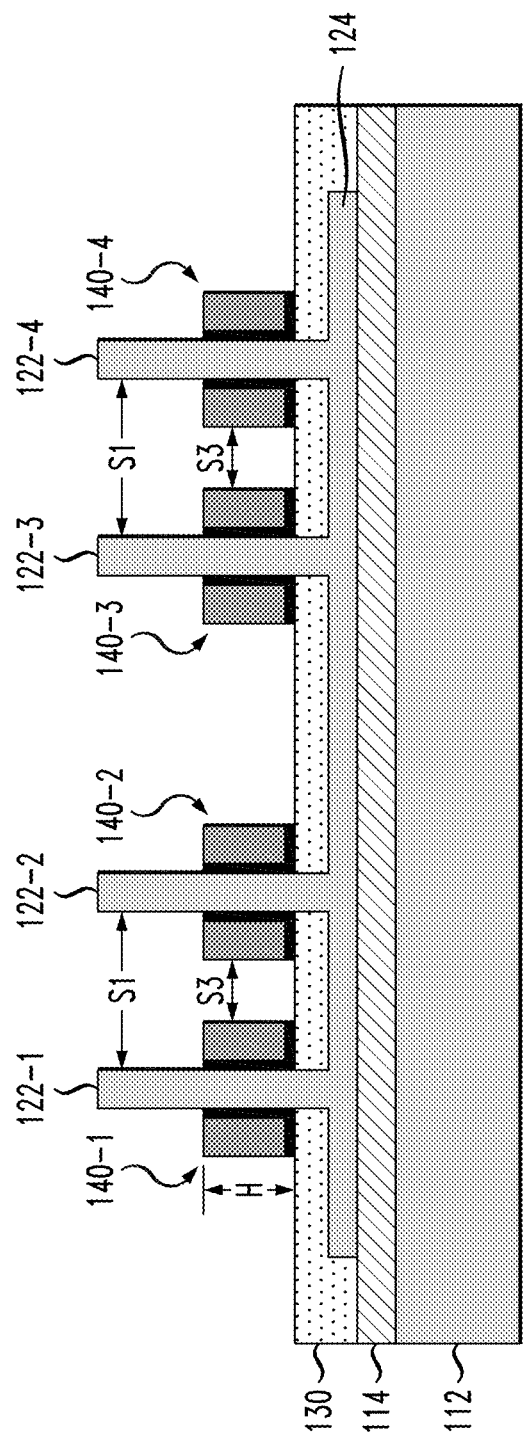

Next, FIGS. 6A and 6B are schematic views of the semiconductor structure of FIG. 5 after patterning the conformal gate stack structure 140 to form the gate structures 140-1, 140-2, 140-3, and 140-4 surrounding the lower portions of the respective vertical semiconductor fin structures 122-1, 122-2, 122-3, and 122-4, according to an embodiment of the invention. FIG. 6A is a schematic top plan view of the semiconductor structure showing that the gate structures 140-1, 140-2, 140-3, and 140-4 are formed around the respective vertical semiconductor fin structures 122-1, 122-2, 122-3, and 122-4. FIG. 6B is a schematic cross-sectional side view of the semiconductor structure taken along line 6B-6B in FIG. 6A showing that the gate structures 140-1, 140-2, 140-3, and 140-4 are formed on lower sidewall portions of the respective vertical semiconductor fin structures 122-1, 122-2, 122-3, and 122-4.

In one embodiment of the invention, the gate structures 140-1, 140-2, 140-3, and 140-4 are formed by patterning the conformal gate stack structure 140 as follows. A first etch process is performed to anisotropically etch and recess the gate electrode layer 144 of the gate stack structure 140. The first etch process can be performed selective to the gate dielectric layer 142 so that the gate dielectric layer 124 serves as an etch protective layer to prevent etching of the upper portions of the vertical semiconductor fin structures 122 during the etch back of the gate electrode layer 144.

Then, a second etch process can be performed to isotropically etch the exposed portions of the thin gate dielectric layer 142 on the upper surfaces of the vertical semiconductor fin structures 122. The second etch process can be performed selective to the material of the remaining gate electrode layer 144 and the vertical semiconductor fin structures 122 so that the upper portions of the vertical semiconductor fin structures 122 and the recessed gate electrode layer 144 are not etched during the etching of the gate dielectric layer 142. The patterning of the conformal gate stack layer 140 of FIG. 5 results in the separate gate structures 140-1, 140-2, 140-3, and 140-4 as shown in FIGS. 6A/6B. In one embodiment of the invention, as shown in FIG. 6B, the gate structures 140-1, 140-2, 140-3, and 140-4 are formed with a height (H) in a range of about 15 nm to about 20 nm.

Figure 7:
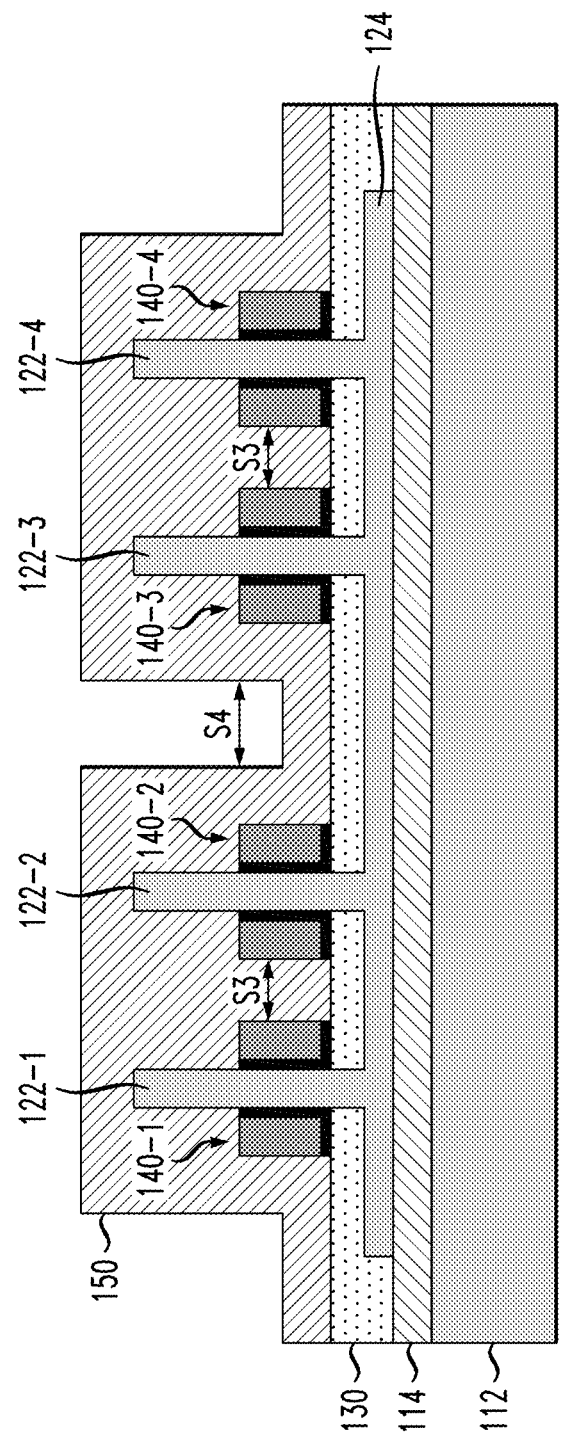
FIG. 7 is a schematic cross-sectional side view of the semiconductor structure of FIG. 6B after depositing layer of insulating material to form an upper insulating spacer layer, according to an embodiment of the invention.
Figure 8:
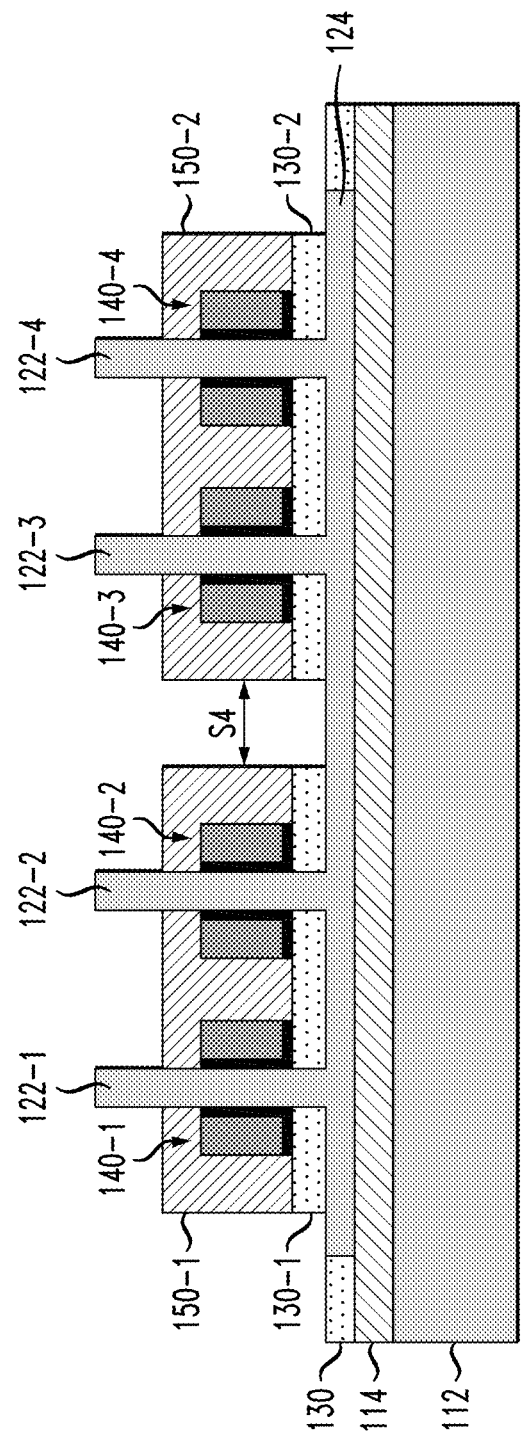
FIG. 8 is a schematic cross-sectional side view of the semiconductor structure of FIG. 7 after patterning the upper insulating spacer layer to form separate upper insulating spacers, according to an embodiment of the invention.

A next step in the illustrative fabrication process is to form the first and second upper insulating spacers 150-1 and 150-2 shown in FIGS. 1A/1B. In one embodiment of the invention, the first and second upper insulating spacers 150-1 and 150-2 are formed using a process that is schematically illustrated in FIGS. 7 and 8. In particular, FIG. 7 is a schematic cross-sectional side view of the semiconductor structure of FIG. 6B after depositing a conformal layer of insulating material 150, and FIG. 8 is a schematic cross-sectional side view of the semiconductor structure of FIG. 7 after patterning the conformal layer of insulting material 150 to form the first and second upper insulating spacers 150-1 and 150-2, according to an embodiment of the invention.

Referring to FIG. 7, in one embodiment of the invention, the conformal layer of insulating material 150 is formed by depositing a conformal layer of dielectric/insulating material over the semiconductor structure of FIGS. 6A/6B until there is "pinch off" of the dielectric/insulating material in the area between each pair of vertical semiconductor fin structures 122-1/122-2 and 122-3/122-4. In particular, in one embodiment of the invention as shown in FIG. 7, the conformal layer of insulating material 150 is formed to a point where the dielectric/insulating material fills the spaces S3 between the adjacent gate structures 140-1/140-2 and 140-3/140-4, as well as the upper region of the spaces S1 between the pair of vertical semiconductor fin structures 122-1/122-2 and the pair of vertical semiconductor fin structures 122-3/122-4. In another embodiment, the conformal layer of insulating material 150 is formed to a point where the dielectric/insulating material fills at least the spaces S3 between the adjacent gate structures 140-1/140-2 and 140-3/140-4, and a least a portion of the spaces S1 between the adjacent pairs of semiconductor fin structures 122-1/122-2 and 122-3/122-4 above the adjacent gate structures 140-1/140-2 and 140-3/140-4, but not all the way to the top of the semiconductor fin structures 122.

The "pinch off" occurs during deposition of the conformal layer of insulating material 150 as the thickness of the conformal layer of insulating material 150 increases to a point where the vertical surfaces of the conformal layer of insulating material 150 (which are being formed on the sidewalls of the adjacent gate structures 140 and semiconductor fin structures 122) come together, thereby filling the spaces S3 between the adjacent gate structures 140-1/140-2 and 140-3/140-4, and the spaces S1 between the adjacent pairs of vertical semiconductor fin structures 122-1/122-2 and 122-3/122-4. This "pinch off" serves multiple purposes.

For example, the "pinch off" ensures that the gate structure 140-1, 140-2, 140-3, and 140-4 will be electrically insulated from source/drain structures that are subsequently grown on the exposed upper portions of the vertical semiconductor fin structures 122. In addition, as explained further below, the "pinch off" enables the etching of self-aligned via contact holes through a pre-metal deposition layer to the drain and source structures using the upper insulating spacers 150-1 and 150-2 (which are patterned from the conformal layer of insulating material 150) as etch stop layers.

As further shown in FIG. 7, the conformal layer of insulating material 150 is formed such that an open space S4 remains (no "pinch off") in the region S2 between the adjacent vertical semiconductor fin structures 122-2 and 122-3 of the different transistors M1 and M2. As explained in further detail below, the space S4 provides sufficient spacing between the upper insulating spacers 150-1 and 150-2 to enable the formation of a self-aligned via contact to a source/drain structure formed on an exposed portion of the planar semiconductor slab structure 124 between the upper insulating spacers 150-1 and 150-2. In one embodiment of the invention, the spacing S4 is at least about 10 nm or more.

In one embodiment of the invention, the conformal layer of insulating material 150 may be formed of any suitable material such as, e.g., silicon oxide, silicon nitride, hydrogenated silicon carbon oxide, silicon based low-k dielectrics, porous dielectrics, or organic dielectrics including porous organic dielectrics. In addition, the conformal layer of insulating material 150 may be formed using known suitable deposition techniques, such as, for example, ALD, CVD, PECVD, PVD, or MBD. In one embodiment of the invention, the conformal layer of insulating material 150 is formed of the same or similar material used to form the lower insulating spacer layer 130.

Next, referring to FIG. 8, the conformal layer of insulating material 150 is patterned to form the first and second upper insulating spacers 150-1 and 150-2. In one embodiment of the invention, the conformal layer of insulating material 150 is patterned using a directional anisotropic etch process (e.g., RIE) to etch back the conformal layer of insulating material 150 and expose upper portions of the vertical semiconductor fin structures 122-1, 122-2, 122-3, and 122-4, as shown in FIG. 8. The etch process is performed to etch the layer of insulating material 150 selective to the material of the vertical semiconductor fin structures 122-1, 122-2, 122-3, and 122-4. Moreover, as shown in FIG. 8, the lower insulating spacer layer 130 is patterned to form the separate lower insulating spacers 130-1 and 130-2 and to expose a portion of the semiconductor slab structure 124 between the transistors M1 and M2 on which a common source/drain contact will be formed.

In one embodiment of the invention, if the lower insulating spacer layer 130 and the conformal layer of insulating material 150 are made from the same or similar material, then the same anisotropic etch process can be used to pattern such layers and form the upper insulating spacers 150-1 and 150-2 and the lower insulating spacers 130-1 and 130-2. In such instance, the conformal layer of insulating material 150 and the lower insulating spacer layer 130 are etched selective to the semiconductor material of the vertical semiconductor fin structures 122 and the semiconductor slab structure 124.

In another embodiment, if the lower insulating spacer layer 130 and the conformal layer of insulating material 150 are made from different materials, then a first etch process can be performed to form the upper insulating spacers 150-1 and 150-2 by etching the conformal layer of insulating material 150 selective to the lower insulating spacer layer 130 and the semiconductor material of the semiconductor fin structures 122. A second etch process is then performed to form the lower insulating spacers 130-1 and 130-2 by etching the lower insulating spacer layer 130 selective to the upper insulating spacers 150-1 and 150-2 and the semiconductor material of the vertical semiconductor fin structures 122 and the planar semiconductor slab structure 124.

Figure 9:
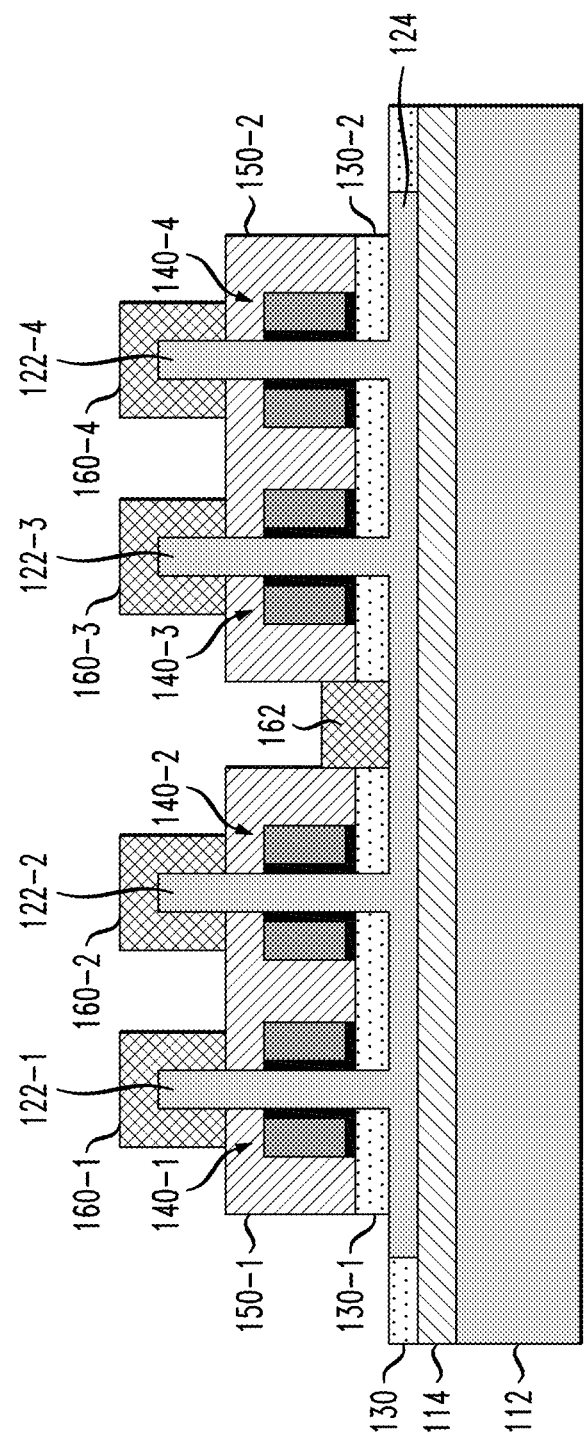
FIG. 9 is a schematic cross-sectional side view of the semiconductor structure of FIG. 8 after forming source and drain structures, according to an embodiment of the invention.

A next step in the illustrative fabrication process is to form source/drain structures for the vertical transistor devices. For example, FIG. 9 is a schematic cross-sectional side view of the semiconductor structure of FIG. 8 after forming the source/drain structures 160-1, 160-2, 160-3, and 160-4 on the exposed portions of the vertical semiconductor fin structures 122-1, 122-2, 122-3, and 122-4, respectively, and forming the source/drain structure 162 on the exposed portion of the planar semiconductor slab structure 124 between the first upper/lower insulating spacers 150-1/130-1 and the second upper/lower insulating spacers 150-2/130-2, according to an embodiment of the invention.

In one embodiment of the invention, the source/drain structures 160 and 162 are epitaxially grown on the exposed portions of the semiconductor fin structures 122 and the planar semiconductor slab structure 124 using known techniques. For example, in one embodiment of the invention, the source/drain structures 160 and 162 may comprise silicon-germanium structures that are epitaxially grown using known techniques such as CVD, molecular beam epitaxy (MBE) or metal-organic chemical vapor deposition (MOCVD), wherein SiH4 and GeH4 can be used as the sources for epitaxial growth of the SiGe source/drain structures. In another embodiment, the semiconductor source/drain structures 160 and 162 may be formed by epitaxial growth of carbon-doped silicon (Si:C) using a Si containing gas such as SiH4 and a carbon containing gas such as CH$_4$.

In other embodiments, the epitaxial source/drain structures 160 and 162 may be in-situ doped during epitaxial growth by adding a dopant gas to the source deposition gas (i.e., the Si-containing gas). Exemplary dopant gases may include a boron-containing gas such as BH$_3$ for pFETs or a phosphorus or arsenic containing gas such as PH$_3$ or AsH$_3$ for nFETs, wherein the concentration of impurity in the gas phase determines its concentration in the epitaxially grown source/drain structures 160 and 162.

Figure 10:
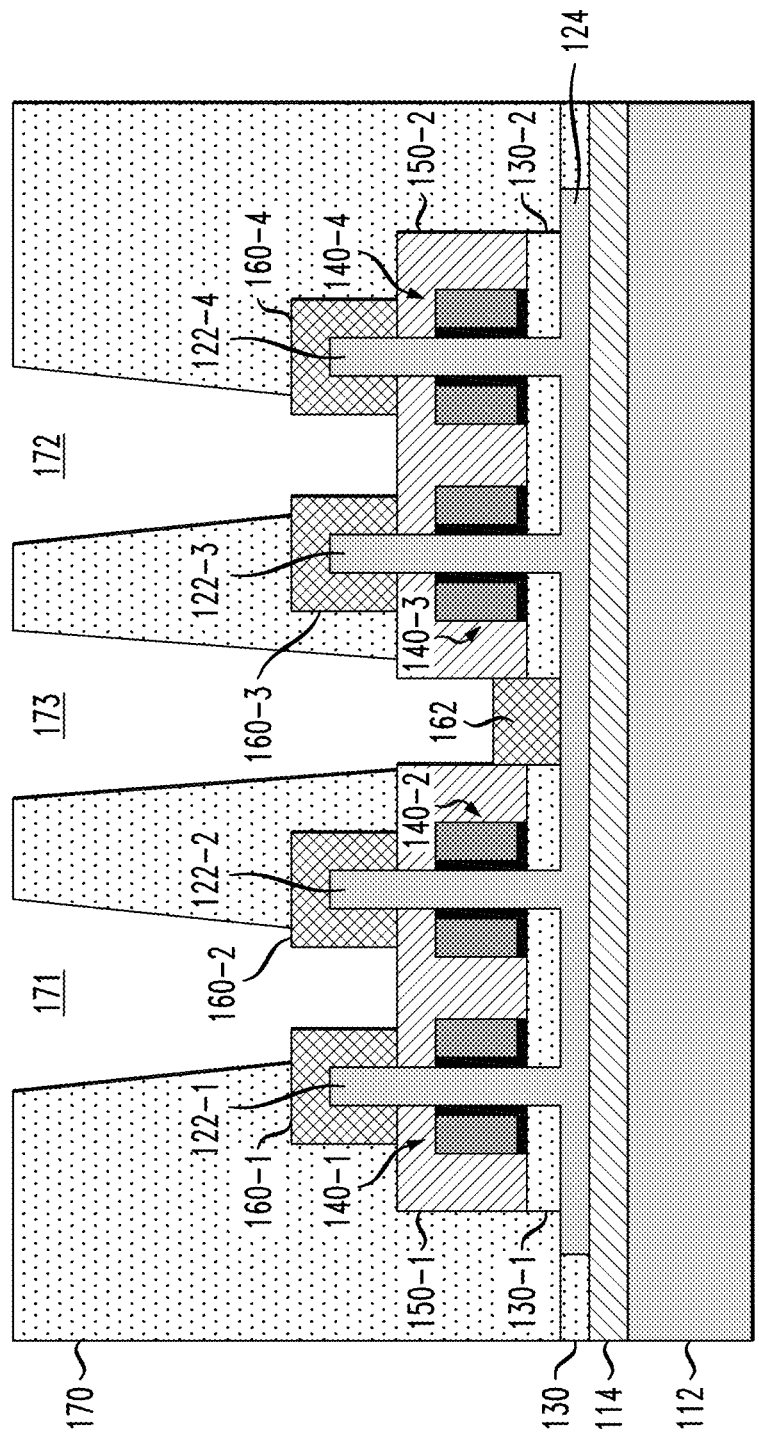
FIG. 10 is a schematic cross-sectional side view of the semiconductor structure of FIG. 9 after depositing an insulating layer and etching contact holes in the insulating layer to the source and drain structures, according to an embodiment of the invention.

A next step in the illustrative fabrication process is to form the PMD (pre-metal dielectric) layer 170 and the drain/source contacts 180 and the gate contacts 190 of a BEOL structure, as shown in FIGS. 1A/1B. For example, FIG. 10 is a schematic cross-sectional side view of the semiconductor structure of FIG. 9 after depositing a layer of dielectric/insulating material to form the PMD layer 170 and etching contact holes 171, 172, and 173 in the PMD layer 170 down to the source/drain structures 160 and 162, according to an embodiment of the invention. In this step, gate contact holes are also formed in the PMD layer 170 down to regions of the gate electrodes 140-1, 140-2, 140-3, and 140-4 that are not covered by the upper insulating spacers 150-1 and 150-2, wherein the gate contact holes are used to form the gate contacts 190 (as shown in FIG. 1B).

The PMD layer 170 may be formed of any suitable material such as, e.g., silicon oxide, silicon nitride, hydrogenated silicon carbon oxide, silicon based low-k dielectrics, porous dielectrics, or organic dielectrics including porous organic dielectrics. In addition, the PMD layer 170 may be formed using known deposition techniques, such as, for example, ALD, CVD, PECVD, spin on deposition, or PVD, followed by a standard planarization process (e.g., CMP) to planarize the upper surface of the PMD layer 170.

In one embodiment, the PMD layer 70 is preferably formed of a material that has high etch selectivity with respect to the dielectric/insulating material used to form the upper insulating spacers 150-1 and 150-2, as well as the material of the source/drain structures 160 and 162. For example, in one embodiment of the invention, the upper insulating spacers 150-1 and 150-2 are formed of a silicon nitride, and the PMD layer 170 layer is formed of silicon oxide. In other embodiments, the insulating materials of the PMD layer 170 and upper insulating spacers 150-1 and 150-2 are selected such that the PMD layer 170 can be etched selective to the upper insulating spacers 150-1 and 150-2 with an etch rate ratio greater than about 10:1, for example. This allows the contact holes 171, 172 and 173 to be formed in a self-aligned manner.

In particular, as shown in FIG. 10, after forming the PMD layer 170, an etch mask is formed (e.g., a photoresist mask is formed by a photolithographic process) having a pattern that is used to etch the via holes 171, 172, and 173 (as well the via holes for the gate contacts 190). The via hole 171 is etched through the PMD layer 170 down to the first upper insulating spacer 150-1 to expose portions of source/drain contact structures 160-1 and 160-2. In addition, the via hole 172 is etched through the PMD layer 170 down to the second upper insulating spacer 150-2 to expose portions of source/drain contact structures 160-3 and 160-4. Moreover, the via hole 173 is etched through the PMD layer 170 down to the source/drain contact structure 162. When etching the PMD layer 170 to form the via holes 171, 172, and 173, the source/drain structures 160 and 162 and upper insulating spacers 150-1 and 150-2 are not etched due to the high etch selectivity of the PMD layer 170.

After forming the via holes 171, 172, and 173, the source/drain via contacts 181, 182, 183 and gate contacts 191, 192, 193, and 194 (as shown in FIGS. 1A/1B) are formed with one or more layers of conductive materials using known techniques. For example, the via holes 171, 172 and 173 (and gate contact via holes) can be lined with a thin conformal barrier diffusion layer (e.g., TiN or SiN, etc.), and then filled with a conductive material including, but not limited to, copper, tungsten, or doped polysilicon, etc., to form the source/drain via contacts 181, 182, 183 and gate contacts 191, 192, 193, and 194.

Because the conductive via contacts 181, 182, and 183, for example, are fabricated using a self-aligned process as discussed above, the spacing S1 between adjacent semiconductor fins of the vertical transistor segments can be about 20 nm or less, depending on the required thickness of the gate structures 140 on the sidewalls of the semiconductor fin structures 122 and the minimum insulation spacing (S3) between the sidewalls of adjacent gate structures 140. Moreover, even when there is some error in the mask pattern or some other process error which causes misalignment of one or more of the via holes 171, 172 and 173, the formation of the conductive via contacts 181, 182, and 183 in a self-aligned manner as described herein ensures contact to the respective source/drain structures 160.

It is to be understood that the methods discussed herein for fabricating vertical semiconductor structures can be incorporated within semiconductor processing flows for fabricating other types of semiconductor devices and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

What is claimed is:
1. A method of forming a semiconductor device, comprising:
    forming first and second semiconductor fins that vertically extend from a substrate;

forming a first gate structure around a lower portion of the first semiconductor fin and a second gate structure around a lower portion of the second semiconductor fin;

forming an insulating spacer which covers a least a portion of the first and second gate structures surrounding the first and second semiconductor fins, and which fills a space between the first and second gate structures;

forming first and second source/drain structures on exposed portions of the first and second semiconductor fins extending from the insulating spacer;

forming a pre-metal dielectric layer over the substrate;

forming a self-aligned contact hole through the pre-metal dielectric layer down to the insulating spacer between the first and second source/drain structures, wherein forming the self-aligned contact hole comprises etching the pre-metal dielectric layer selective to the insulating spacer so that the insulating spacer serves as an etch stop and protects the first and second gate structures when etching the pre-metal dielectric layer; and filling the self-aligned contact hole with a conductive material to form a via contact which makes contact to portions of the first and second source/drain structures exposed by the self-aligned contact hole.

2. The method of claim 1, wherein the first and second semiconductor fins are patterned from an active silicon layer of a silicon-on-insulator substrate.

3. The method of claim 1, wherein forming the first and second gate structures comprises:

depositing a conformal gate dielectric layer over the first and second semiconductor fins;

depositing a conformal gate electrode layer over the conformal gate dielectric layer; and patterning the conformal gate dielectric and gate electrode layers to expose upper portions of the semiconductor fins, and form the first and second gate structures, which are separate from each other.

4. The method of claim 1, wherein forming the insulating spacer comprises:

depositing a conformal layer of insulating material until the space between the first and second gate structures and a space between the first and second semiconductor fins is filled with the conformal layer of insulating material; and etching down the conformal layer of insulating material to expose upper portions of the first and second semiconductor fins, while maintaining the first and second gate structures covered by the conformal layer of insulating material forming the insulating spacer.

5. The method of claim 1, wherein forming the first and second source/drain structures comprises epitaxially growing a layer of semiconductor material on the exposed portions of the first and second semiconductor fins extending from the insulating spacer.

6. The method of claim 1, wherein the first and second semiconductor fins, the insulating spacer, the first and second gate structures, and the first and second source/drain structures form at least part of a single field-effect transistor device.

7. The method of claim 1, wherein a spacing between the first and second semiconductor fins is about 20 nm or less.

8. The method of claim 1, further comprising forming first and second gate contacts in the pre-metal dielectric layer which contact portions of the first and second gate structures, respectively, which are not covered by the insulating spacer.

9. A semiconductor integrated circuit device formed by a method comprising:

forming first and second semiconductor fins that vertically extend from a substrate;

forming a first gate structure around a lower portion of the first semiconductor fin and a second gate structure around a lower portion of the second semiconductor fin;

forming an insulating spacer which covers a least a portion of the first and second gate structures surrounding the first and second semiconductor fins, and which fills a space between the first and second gate structures;

forming first and second source/drain structures on exposed portions of the first and second semiconductor fins extending from the insulating spacer;

forming a pre-metal dielectric layer over the substrate;

forming a self-aligned contact hole through the pre-metal dielectric layer down to the insulating spacer between the first and second source/drain structures, wherein forming the self-aligned contact hole comprises etching the pre-metal dielectric layer selective to the insulating spacer so that the insulating spacer serves as an etch stop and protects the first and second gate structures when etching the pre-metal dielectric layer; and filling the self-aligned contact hole with a conductive material to form a via contact which makes contact to portions of the first and second source/drain structures exposed by the self-aligned contact hole.

10. A semiconductor device, comprising:

first and second semiconductor fins vertically extending from a semiconductor substrate;

a first gate structure disposed around a lower portion of the first semiconductor fin;

a second gate structure disposed around a lower portion of the second semiconductor fin;

an insulating spacer which covers a least a portion of the first and second gate structures surrounding the first and second semiconductor fins and which fills a space between the first and second gate structures;

first and second source/drain structures formed on exposed portions of the first and second semiconductor fins extending from the insulating spacer;

a pre-metal dielectric layer disposed over the substrate; and a conductive via contact formed in the pre-metal dielectric layer, wherein the conductive via contact is self-aligned to and in contact with, the first and second source/drain structures.

11. The semiconductor device of claim 10, wherein the first and second semiconductor fins are patterned from an active silicon layer of a silicon-on-insulator substrate.

12. The semiconductor device of claim 10, wherein the first and second gate structures each comprise a stack structure comprising a gate dielectric layer and a gate electrode layer disposed over the gate dielectric layer.

13. The semiconductor device of claim 10, wherein the insulating spacer comprises a conformal layer of insulating material which is deposited to fill the space between the first and second gate structures, and to fill a space between the first and second semiconductor fins, and then etched back to expose the upper portions of the first and second semiconductor fins.

14. The semiconductor device of claim 10, wherein the first and second source/drain structures comprise epitaxially grown semiconductor layers.

15. The semiconductor device of claim 10, wherein an etch selectivity of the pre-metal dielectric layer to the insulating spacer is at least 10:1.

16. The semiconductor device of claim 10, wherein the first and second semiconductor fins, the insulating spacer, the first and second gate structures, and the first and second source/drain structures form at least part of a single field-effect transistor device.

17. The semiconductor device of claim 10, wherein a spacing between the first and second semiconductor fins is about 20 nm or less.

18. The semiconductor device of claim 10, further comprising first and second gate contacts formed in the pre-metal dielectric layer which contact portions of the first and second gate structures respectively, which are not covered by the insulating spacer.

* * * * *